US009093164B2

(12) United States Patent
Filippi et al.

(10) Patent No.: US 9,093,164 B2
(45) Date of Patent: Jul. 28, 2015

(54) REDUNDANT VIA STRUCTURE FOR METAL FUSE APPLICATIONS

(75) Inventors: Ronald G. Filippi, Wappingers Falls, NY (US); Griselda Bonilla, Fishkill, NY (US); Kaushik Chanda, Hopewell Junciton, NY (US); Samuel S. Choi, Beacon, NY (US); Stephan Grunow, Poughkeepsie, NY (US); Naftali E. Lustig, Croton-on-Hudson, NY (US); Andrew H. Simon, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 817 days.

(21) Appl. No.: 13/298,661

(22) Filed: Nov. 17, 2011

(65) Prior Publication Data
US 2013/0127584 A1    May 23, 2013

(51) Int. Cl.
*H01H 85/04* (2006.01)
*G11C 17/16* (2006.01)
*H01L 23/525* (2006.01)
*H01L 23/522* (2006.01)
*G11C 29/00* (2006.01)
*H01H 85/46* (2006.01)
*H01L 23/532* (2006.01)

(52) U.S. Cl.
CPC ............. *G11C 17/16* (2013.01); *G11C 29/702* (2013.01); *H01L 23/5226* (2013.01); *H01L 23/5256* (2013.01); *H01L 23/5329* (2013.01); *H01L 23/53295* (2013.01); *H01H 2085/466* (2013.01); *H01L 23/53223* (2013.01); *H01L 23/53238* (2013.01); *H01L 23/53252* (2013.01)

(58) Field of Classification Search
CPC .. G11C 29/702; G11C 17/16; H01L 23/5256; H01L 23/53295; H01L 23/5329; H01L 23/5226; H01L 23/53223; H01L 23/53238; H01L 23/53252; H01H 2085/466
USPC ........................................ 337/297; 365/225.7
See application file for complete search history.

(56) References Cited

U.S. PATENT DOCUMENTS

| 3,988,823 | A | 11/1976 | Hu |
| 6,100,118 | A | 8/2000 | Shih et al. |
| 6,181,012 | B1 * | 1/2001 | Edelstein et al. ............. 257/762 |
| 6,329,719 | B1 | 12/2001 | Nakamura |
| 6,919,639 | B2 | 7/2005 | Ho et al. |
| 7,067,359 | B2 | 6/2006 | Wu |
| 7,290,226 | B2 | 10/2007 | Correale, Jr. et al. |
| 7,308,669 | B2 | 12/2007 | Buehler et al. |
| 7,343,570 | B2 | 3/2008 | Bowers et al. |
| 7,479,857 | B2 | 1/2009 | McKinzie, III |
| 7,671,444 | B2 | 3/2010 | Wang et al. |

(Continued)

*Primary Examiner* — Anatoly Vortman
(74) *Attorney, Agent, or Firm* — L. Jeffrey Kelly; Catherine Ivers

(57) ABSTRACT

A metal fuse structure using redundant vias formed on one metal level in a stacked via metal fuse structure to force failures to occur in the metal level that does not have the redundant vias. The metal fuse structure includes a first dielectric layer having a conductor, a second dielectric layer above the first dielectric layer having a first conductive line and a first via, the first via is on the conductor, the first conductive line is on the first via, the first via is the only electrical connection between the first conductive line and the conductor, and a third dielectric layer above the second dielectric layer having a second conductive line, a second via and a third via, the second via and the third via are both on the first conductive line, the second conductive line is on both the first via and the second via.

21 Claims, 6 Drawing Sheets

(56) References Cited

U.S. PATENT DOCUMENTS

| | | | |
|---|---|---|---|
| 2001/0016428 A1* | 8/2001 | Smith et al. | 438/784 |
| 2001/0019141 A1* | 9/2001 | Takahashi | 257/295 |
| 2001/0028098 A1* | 10/2001 | Liou | 257/531 |
| 2001/0038115 A1* | 11/2001 | Amanuma | 257/303 |
| 2002/0046880 A1* | 4/2002 | Takubo et al. | 174/261 |
| 2002/0105079 A1* | 8/2002 | Yamaguchi | 257/748 |
| 2004/0070078 A1 | 4/2004 | Ho et al. | |
| 2004/0101663 A1* | 5/2004 | Agarwala et al. | 428/209 |
| 2009/0302416 A1 | 12/2009 | Abou-Khalil et al. | |
| 2011/0055785 A1 | 3/2011 | Chakanakar et al. | |

\* cited by examiner

REDUNDANT VIA STRUCTURE FOR METAL FUSE APPLICATIONS

BACKGROUND OF THE INVENTION

1. Field of the Invention

The present invention relates to electronic fuses (e-fuses). More specifically, the present invention relates to redundant via structures for metal fuse applications.

2. Description of the Related Art

In advanced technologies, e-fuses have been implemented at the polycrystalline silicon (PC) level. During programming, a high current pulse of short duration is passed through the structure. This irreversibly migrates silicide on top of the PC, causing a change in resistance and thus acting as a programmable fuse.

As scaling progresses, it is becoming harder to implement these e-fuses at the PC level due to drop in maximum allowable currents through the first metal layer or conductor. Also, the collateral damage associated with the event is becoming more difficult to contain. Further, the application of high-k metal gate (HMG) in the front end of the line (FEOL) prevents the use of PC fuses. As a result, there is a drive to implement these fuses at the metal interconnect levels in back end of the line (BEOL) and use the phenomenon of electromigration (EM) to program fuses. Current BEOL e-fuse structures are typically single via or a multi-level stack via structure. The void formation is unpredictable and the program current can be high.

The power requirements to cause EM in copper (Cu) interconnects are much larger than the typical PC level fuses. This is partly due to the fact that the liner materials used in Cu interconnects, such as tantalum (Ta) and tantalum nitride (TaN), must be blown along with the Cu in order to achieve proper fuse programming. Hence, there is a need to devise fuse structures that are susceptible to EM without compromising the reliability of the remaining interconnects.

In a conventional metal fuse approach, as shown in FIG. 1, a two-level structure is used. The two-level structure comprises conductor 111 embedded in dielectric layer 110, and via 121 and line 122 embedded in dielectric layer 120. A cap layer 123 is typically deposited over line 122 and dielectric layer 120. A cap layer 113 is typically deposited over dielectric layer 110 and conductor 111 as well. Electron flow is from via 121 into line 122. A high current is applied between the positive current connect (I+) and negative current connection (I−) to induce EM failure. Voltage across the structure is measured using the positive (V+) and negative (V−) voltage connections. The electron flow through the fuse structure is from the lower level metal, conductor 111, to the upper level metal, line 122.

With this design, some of the failures occur in via 121 while other failures occur in line 122, resulting in a lack of control over the failure location and leading to variability in the final resistance of the fuse structure after programming. Moreover, it is not possible to electrically determine whether the failure is in via 121 or line 122. Failures in line 122 are less desirable because cap layer 123 may be compromised during the programming process.

The programming process with this design may lead to damage in the surrounding dielectric layer 120. It is likely that material from the blown fuse area will be present in the damaged dielectric region. If this is the case, then there is concern that the material will migrate throughout the dielectric, causing a short circuit to neighboring lines.

Due to the nature of the liner deposition process, liner 124 coverage in via 121 depends on which via sidewall is being covered. In the case of Ta and TaN, a physical vapor deposition (PVD) process is used such that the line feature above via 121 will affect the liner coverage in the via. The same holds for the Cu seed that is deposited by PVD following liner deposition. As shown in FIG. 1, poor liner coverage occurs on via sidewall 125, opposite to the end of the line above, while good liner coverage occurs on via sidewall 126. This is a result of a dielectric shadowing effect in which the presence of a line end prevents liner material from adequately coating the opposite via sidewall. This represents a less than ideal situation because vias with good liner coverage will require higher power to be blown. The failures in the line are less desirable because cap layer 123, such as silicon nitride ($Si_3N_4$) or silicon carbide (SiC) may be compromised during the programming process. Finally, the programming process will lead to damage in the surrounding dielectric region. It is likely that material from the blown fuse area will be present in the damaged dielectric region. In this situation, there is a concern that the material will migrate throughout the dielectric, causing a short circuit to neighboring lines.

In order to cause more failures in the via, a stacked via metal fuse structure can be also used, as shown in FIG. 2. The three level structure comprises conductor 211 embedded in dielectric layer 210, and via 221 and line 222 embedded in dielectric layer 220. A cap layer 213 is typically deposited over dielectric layer 210 and conductor 211 as well as cap layer 223 over dielectric layer 220 and line 222. The structure further comprises via 231 and line 232 embedded in dielectric layer 230 and electrically connected to line 222. A cap layer 233 is typically deposited over line 232 and dielectric layer 230. Electron flow is from via 231 into line 232. Here, failures are more likely to occur in the vias than in metal line 232 due to the presence of both via 221 and via 231. However, such a structure still has the possibility of line failures.

Therefore, a structure is needed such that failure locations are better controlled.

SUMMARY OF THE INVENTION

The present invention includes use of redundant vias in e-fuses. The redundant vias are formed on one metal level in a stacked via metal fuse structure to force failures to occur in the metal level that does not have the redundant vias.

According to an aspect of the present invention, a metal fuse structure is provided. The metal fuse structure includes: a first dielectric layer having a metal feature embedded therein, the metal feature having an upper surface; a second dielectric layer on the first dielectric layer having a first metal connector embedded therein, having a first via and a first line above the first via; and a third dielectric layer on the second dielectric layer having a second metal connector embedded therein having a second via and third via and a second line above the second via and the third via, wherein the second via and third via are in electrical contact with the first line.

According to another aspect of the present invention, a metal fuse structure is provided. The metal fuse structure includes: a first dielectric layer having a metal feature embedded therein, the metal feature having an upper surface; a second dielectric layer on the first dielectric layer having a first metal connector embedded therein, having a first via and a second via and a first line above the first and second via; and a third dielectric layer on the second dielectric layer having a second metal connector embedded therein having a third via and a second line above the third via, wherein the third via is in electrical contact with the first line.

According to a further aspect of the present invention, a metal fuse structure is provided. The metal fuse structure includes: a first dielectric layer having a metal feature embedded therein, the metal feature having an upper surface; a second dielectric layer on the first dielectric layer having a first metal connector embedded therein, having at least a first via and a first line above the first via; a third dielectric layer on the second dielectric layer having a second metal connector embedded therein having a second via and a second line above the second via, wherein the second via is in electrical contact with the first line; and a third via formed in at least one of the first metal connector and the second metal connector.

BRIEF DESCRIPTION OF THE DRAWINGS

The features and elements of the present invention are set forth with respect to the appended claims and illustrated in the drawings.

DETAILED DESCRIPTION OF THE PREFERRED EMBODIMENTS

The following describes embodiments of the present invention with reference to the drawings. The embodiments are illustrations of the invention, which can be embodied in various forms. The present invention is not limited to the embodiments described below, rather representative for teaching one skilled in the art how to make and use it. Some aspects of the drawings repeat from one drawing to the next. The aspects retain their same numbering from their first appearance throughout each of the preceding drawings.

The present invention includes use of redundant vias in e-fuses. The redundant vias are formed on one metal level in a stacked via metal fuse structure to force failures to occur in the metal level that does not have the redundant vias.

Figure 1:
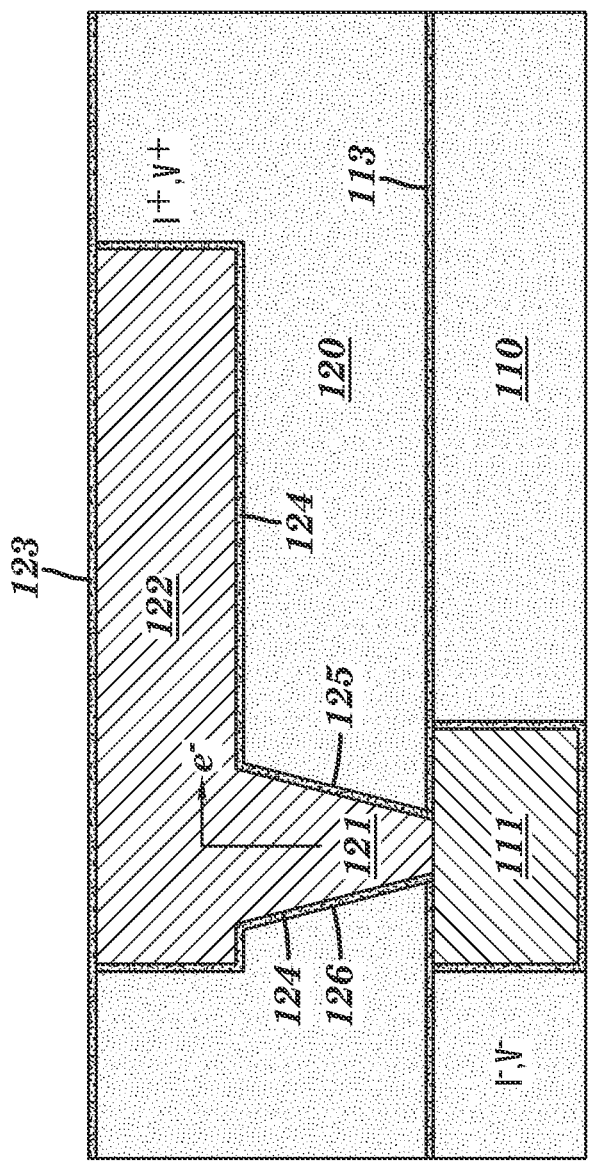
FIG. 1 (prior art) schematic cross section of a conventional metal fuse structure.
Figure 2:
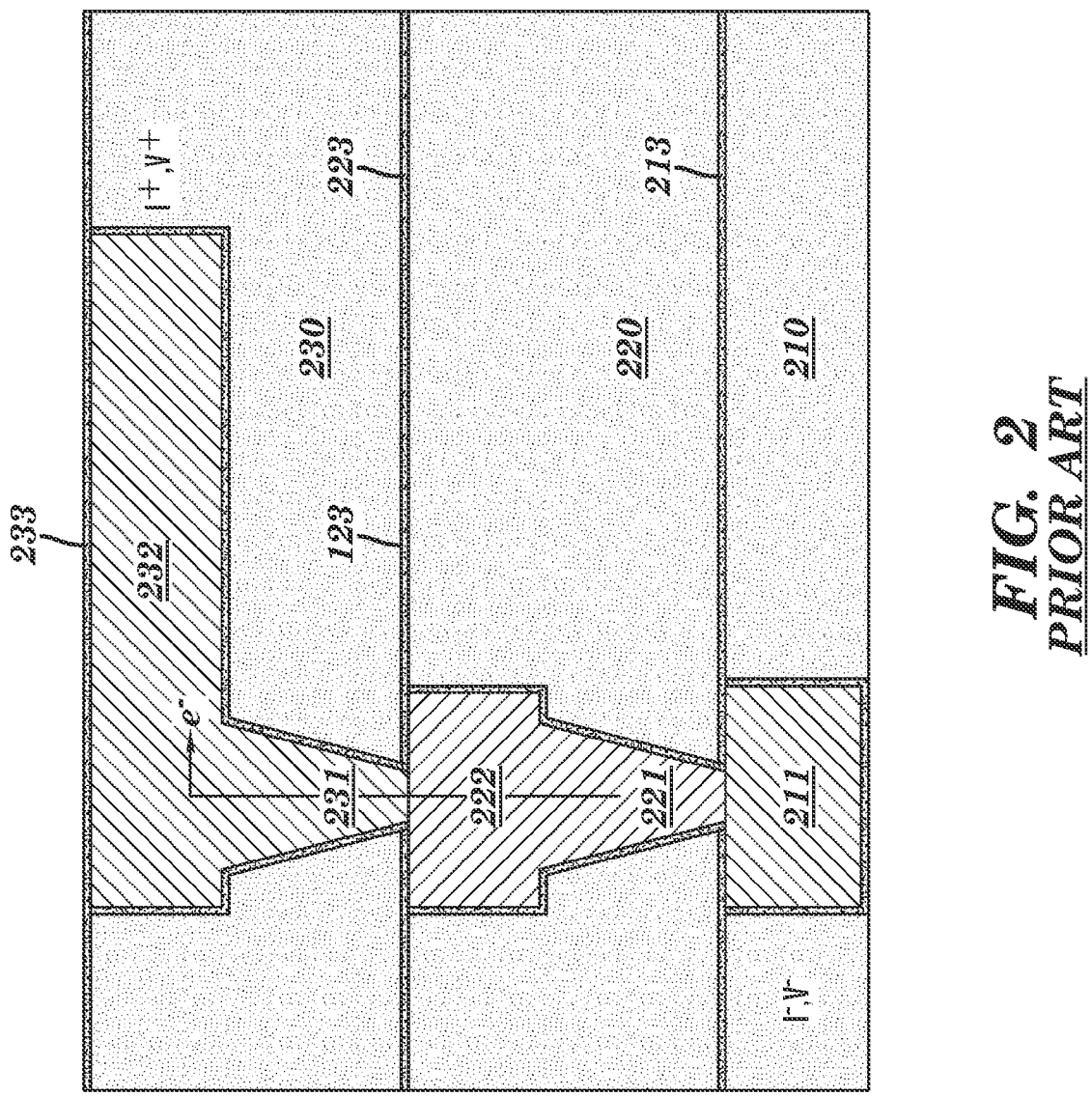
FIG. 2 (prior art) schematic cross section of a conventional stacked via metal fuse structure.
Figure 3:
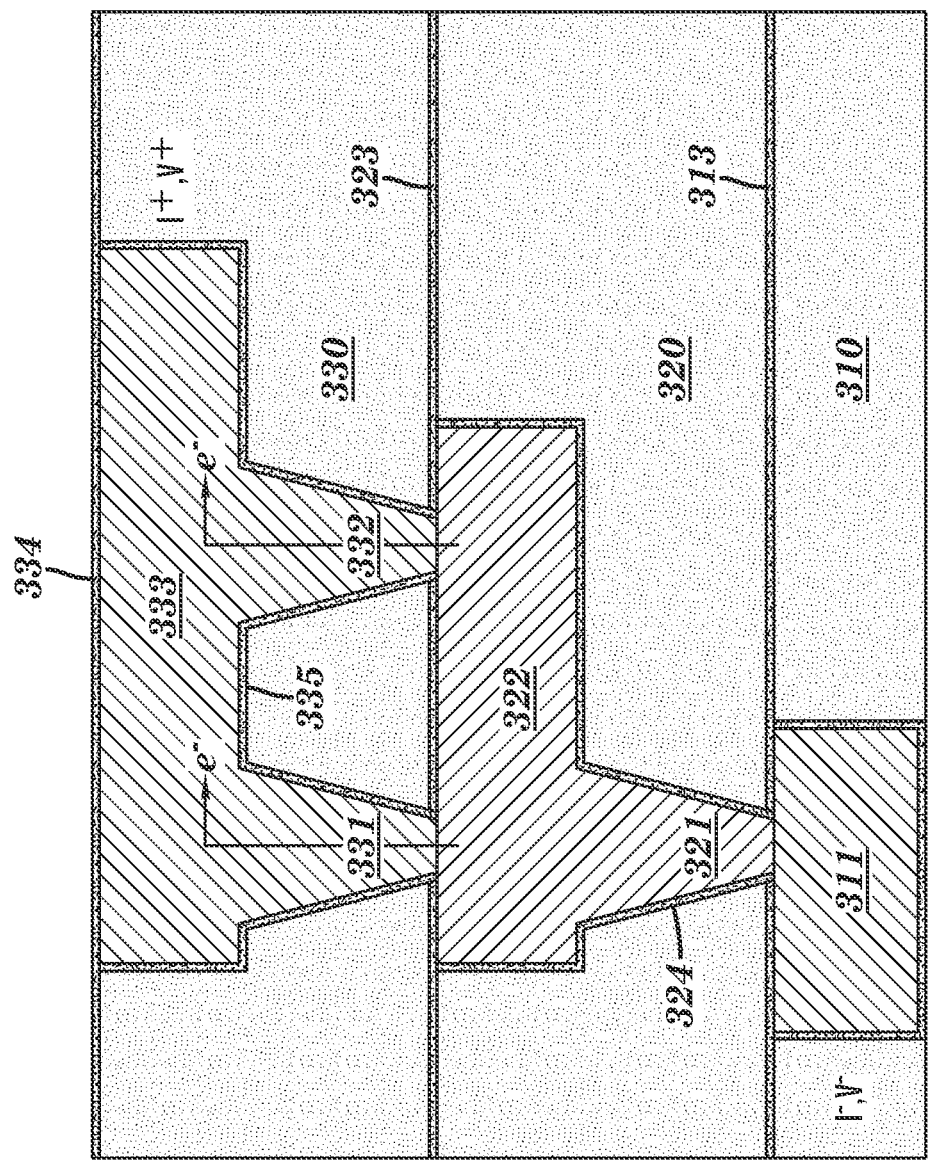
FIG. 3 schematic cross section of the proposed stacked via metal fuse structure with redundant vias in the third dielectric.

With reference now to FIG. 3, a fuse structure with redundant vias in the third metal level in accordance with the present invention is shown. The fuse structure is above and in electrical contact with conductor 311 embedded in dielectric material 310. There is a cap layer 313 on dielectric material 310 and conductor 311. Dielectric layer 320 is disposed above dielectric material 310. Conductive via 321 and conductive line 322 are disposed in cavity 324 formed in dielectric layer 320. Preferably, conductive line 322 is formed above conductive via 321 and in such a manner that conductive via 321 is off center from conductive line 322. Cap layer 323 is deposited on dielectric layer 320 and conductive line 322. Cap layers 313 and 323 are removed from an area between the respective metal layer, either conductor 311 or conductive line 322, and the respective via.

Dielectric layer 330 is disposed above dielectric layer 320. Conductive vias 331 and 332 and conductive line 333 are disposed in cavity 335 formed in dielectric layer 330. Conductive vias 331 and 332 and conductive line 333 are in electrical contact with conductive via 321 and conductive line 322. Cap layer 334 is disposed on conductive line 333 and dielectric layer 330. The electron flow through the fuse structure is from the lower level metal, conductor 311, through conductive via 321, conductive line 322 and conductive vias 331 and 332, to the upper level metal, conductive line 333.

Any suitable dielectric material may be used for dielectric material 310 and dielectric layers 320 and 330. The material used for dielectric 310, 320 and 330 may be the same or different. Typical dielectric materials include any now known or later developed porous or non-porous dielectric material such as silicon oxide (SiO), silicon nitride ($Si_3N_4$), hydrogenated silicon oxycarbide (SiCOH), silsesquioxanes, carbon-doped oxides (i.e., organosilicates) that include atoms of silicon (Si), carbon (C), oxygen (O), and/or hydrogen (H), thermosetting polyarylene ethers, SiLK™ (a polyarylene ether available from Dow Chemical Corporation), spin-on silicon-carbon contained polymer material available from JSR Corporation, and other low dielectric constant (<3.9) materials or layers thereof Each of capping, or dielectric barrier, layers 313, 323 and 334 may be composed of the same material or different materials. Typical dielectric materials for the capping layers include any now known or later developed dielectric layer such as silicon carbide (SiC), silicon nitride ($Si_3N_4$), silicon dioxide ($SiO_2$), and nitrogen or hydrogen doped silicon carbide (SiC(N,H)). Preferably, the conductive vias and conductive lines are lined with a liner material (not shown). For conductive vias and conductive lines comprised primarily of copper, the two preferred liner materials are tantalum (Ta) and tantalum-nitride (TaN). Other liner materials include titanium (Ti), titanium-nitride (TiN), ruthenium (Ru) and ruthenium-nitride (RuN).

Any suitable conductive material may be used for conductor 311, conductive vias 321, 331 and 332, and conductive lines 322 and 333. The material used for each of the aforementioned metals may be the same or different. Typical conductive materials include copper (Cu), aluminum (Al), silver (Ag), gold (Au) and alloys.

In FIG. 3, the current through each of conductive vias 331 and 332 is less than that flowing through conductive via 321. As a result of a higher current density, conductive via 321 is more likely to fail during fuse programming. Moreover, the shorter the length of conductive line 322, the less likely a failure will occur in the line. There are fewer possible failure locations in a shorter conductive line.

Figure 4:
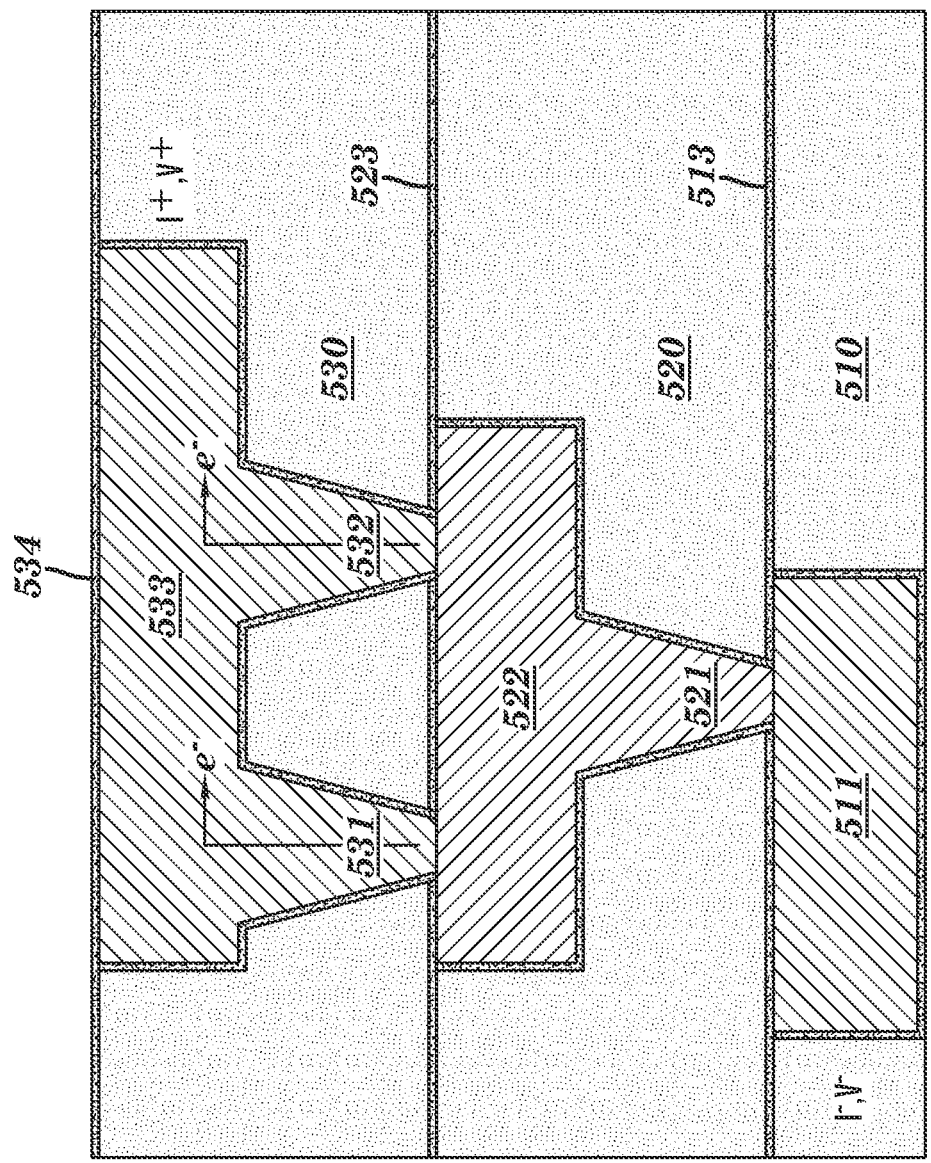
FIG. 4 is a top view of the proposed stacked via metal fuse structure with redundant vias in the third dielectric.

FIG. 4 shows a fuse structure with redundant vias in the third metal level having the via in the second metal level formed in the center of the second metal. With conductive via 521 formed in the center of conductive line 522, there is a greater likelihood that approximately half of the current is flowing through each of conductive vias 531 and 532. However, the placement of conductive via 521 can be varied to find the optimal placement based on resistivity in conductive line 522.

Figure 5:
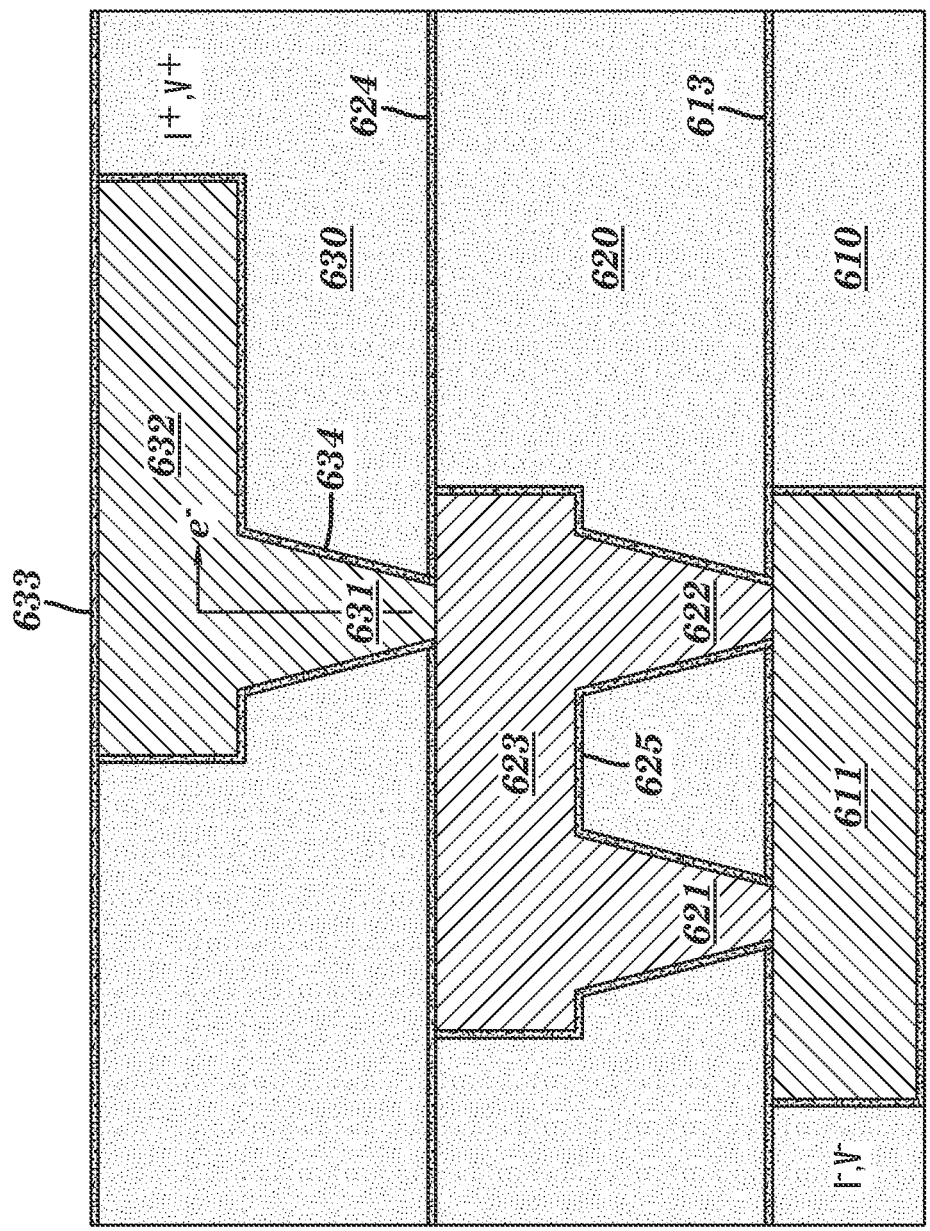
FIG. 5 schematic cross section of the proposed stacked via metal fuse structure with redundant vias in the third dielectric layer and the via in first dielectric in the center of the metal line.

With reference now to FIG. 5, a fuse structure with redundant vias in the second metal level in accordance with the present invention is shown. The fuse structure is above and in electrical contact with conductor 611 embedded in dielectric material 610. There is a cap layer 613 on dielectric material 610 and conductor 611. Dielectric layer 620 is disposed above dielectric material 610. Conductive vias 621 and 622 and conductive line 623 are disposed in cavity 625 formed in dielectric layer 620. Preferably, conductive line 623 is formed above conductive vias 621 and 622. Cap layer 624 is deposited on dielectric layer 620 and conductive line 623. Cap layers 613 and 624 are removed from an area between the respective metal layer, either conductor 611 or conductive line 623, and the respective vias.

Dielectric layer 630 is disposed above dielectric layer 620. Conductive via 631 and conductive line 632 are disposed in cavity 634 formed in dielectric layer 630. Conductive via 631 and conductive line 632 are in electrical contact with conductive vias 621 and 622 and conductive line 623. Cap layer 633 is disposed on conductive line 632 and dielectric layer 630. The electron flow through the fuse structure is from the lower level metal, conductor 611, through conductive vias 621 and 622, conductive line 623 and conductive via 631, to the upper level metal, conductive line 632.

Any suitable dielectric material may be used for dielectric material 610 and dielectric layers 620 and 630. The material used for dielectric 610, 620 and 630 may be the same or different. Typical dielectric materials include any now known or later developed porous or non-porous dielectric material such as silicon oxide (SiO), silicon nitride ($Si_3N_4$), hydrogenated silicon oxycarbide (SiCOH), silsesquioxanes, carbon-doped oxides (i.e., organosilicates) that include atoms of silicon (Si), carbon (C), oxygen (O), and/or hydrogen (H), thermosetting polyarylene ethers, SiLK™ (a polyarylene ether available from Dow Chemical Corporation), spin-on silicon-carbon contained polymer material available from JSR Corporation, and other low dielectric constant (<3.9) materials or layers thereof Each of capping, or dielectric barrier, layers 613, 624 and 633 may be composed of the same material or different materials. Typical dielectric materials for the capping layers include any now known or later developed dielectric layer such as silicon carbide (SiC), silicon nitride ($Si_3N_4$), silicon dioxide ($SiO_2$), and nitrogen or hydrogen doped silicon carbide (SiC(N,H)).

Conductive vias 621, 622 and 631, and conductive lines 623 and 632 are lined with a liner material including, but not limited to, tantalum (Ta), tantalum nitride (TaN), titanium (Ti), titanium nitride (TiN), ruthenium (Ru) and ruthenium nitride (RuN). Tantalum and tantalum nitride are more common for use in copper structures.

Any suitable conductive material may be used for conductor 611, conductive vias 621, 622 and 631, and conductive lines 623 and 632. The material used for each of the aforementioned metals may be the same or different. Typical conductive materials include copper (Cu), aluminum (Al), silver (Ag), gold (Au) and alloys.

The fuse structure shown in FIG. 5 is more likely to experience failures during fuse programming in conductive via 631 as compared to conductive vias 621 and 622. There is a higher probability in this embodiment that a failure may occur in conductive line 632.

However, the probability of failure in conductive line 632 is higher for the structure shown in FIG. 5 than the probability of failure in conductive line 322 for the structure shown in FIG. 3 because the length of conductive line 322 is shorter than the length of conductive line 632. This fact makes the structure with redundant vias in the second metal layer more effective in terms of forcing fails to occur in the vias. By placing redundant vias at the metal level where fails are not desired, failure locations after programming can be better controlled.

Figure 6:
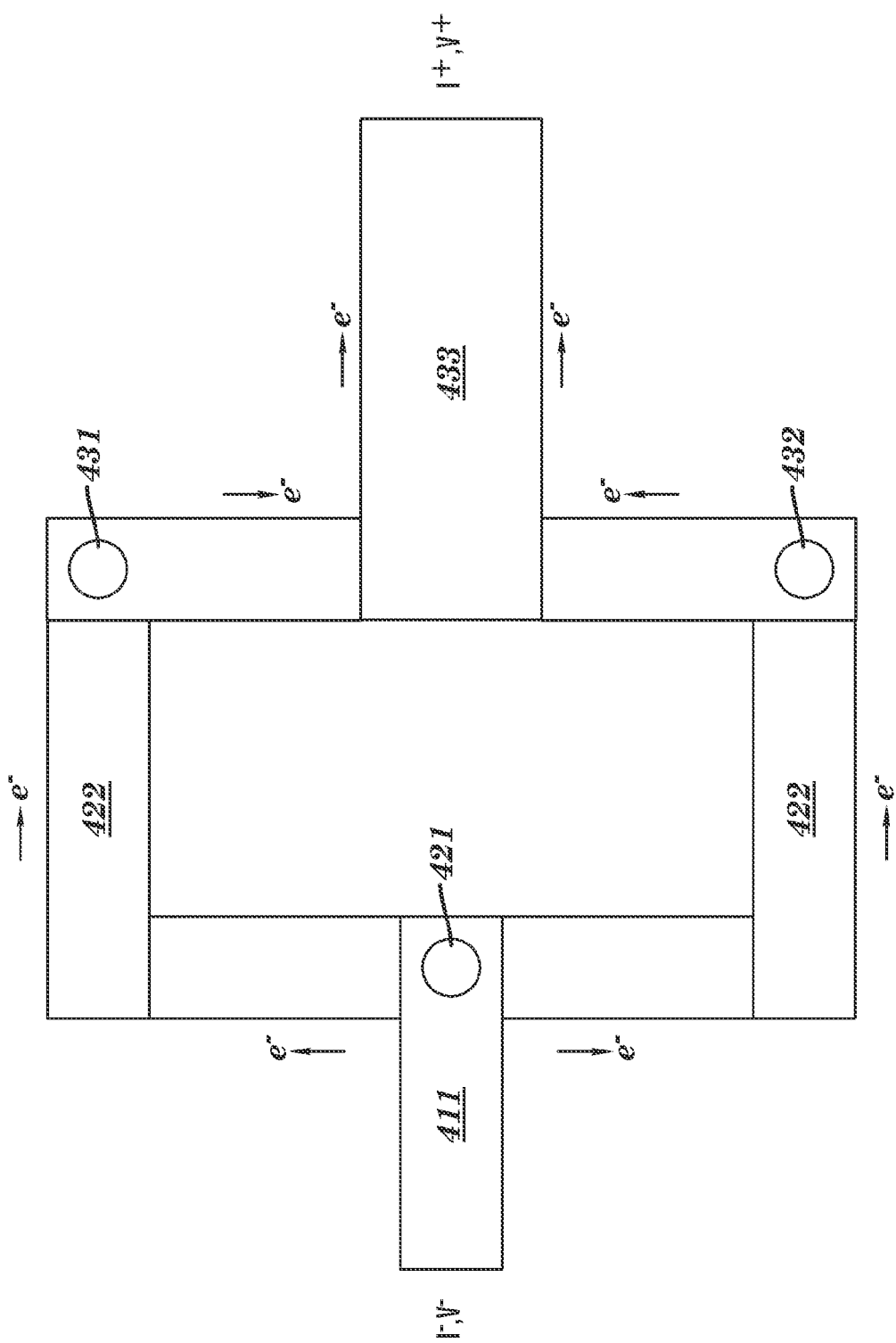
FIG. 6 schematic cross section of the proposed stacked via metal fuse structure with redundant vias in the second dielectric layer.

FIG. 6 is an example of a top down view of an embodiment of the present invention further illustrating the lower current density in conductive line 422 and conductive vias 431 and 432. The current is divided into segments after flowing from conductor 411 into conductive line 422. The current then regroups in conductive line 433. Conductive line 433 is less susceptible to failures than conductive vias 421, 431 and 432 because it is wider. As conductive line 433 is made wider, it is even less susceptible to failures.

The aforementioned fuse structures may be formed by the following process. A dielectric layer is deposited on a dielectric material having a conductor embedded therein. An opening or cavity for at least one conductive via and a conductive line is next formed in dielectric layer. Preferably, the cavity may be a dual damascene cavity to provide openings for the conductive via and conductive line simultaneously. A liner is then deposited on at least vertical surfaces of the cavity or cavities by a physical vapor deposition (PVD) or chemical vapor deposition (CVD) process for example. Preferably, the liner is deposited on the bottom surface of the cavity or cavities as well. The cavity or cavities is then filled with a conductive material such as Cu using, for example, an electroplating process, to form at least one conductive via and a conductive line. The via may be formed either at the left, right or center of the line.

Another dielectric layer is deposited on the previous dielectric layer, at least one opening or cavity is formed in the dielectric layer, a liner deposited on the surfaces of the cavity or cavities and filled with a conductive material to form at least one conductive via and a conductive line.

The dielectric layers can be deposited by a variety of methods. Chemical vapor deposition (CVD) is the preferred method for carbon-doped oxide dielectrics (SiCOH). Spin on processes are the preferred methods for polymer based dielectrics.

Cavities may be formed using any suitable lithographic patterning and etching process. Conductive vias and conductive lines may be formed using a single or dual damascene process. Preferably, a dual damascene process is used.

A physical vapor deposition (PVD) process is used to deposit liner materials such as Ta and TaN. Other deposition processes, such as chemical vapor deposition (CVD) and atomic layer deposition (ALD), may be used to deposit liner materials as well.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A metal fuse structure comprising:
   a first dielectric layer having a metal feature embedded therein, the metal feature having an upper surface;
   a second dielectric layer above the first dielectric layer having a first metal connector embedded therein, the first metal connector comprising a first via and a first line above the first via, the first via is in direct contact with and extends between the upper surface of the metal feature and the first line, and the first via is the only electrical connection between the metal feature and the first line; and
   a third dielectric layer above the second dielectric layer having a second metal connector embedded therein, the second metal connector comprising a second via, a third via and a second line above both the second via and the third via, the second via and the third via are in electrical contact with the first line and extend between the first line and the second line, and the second via and the third via are the only electrical connections between the first line and the second line.

2. The metal fuse structure of claim 1, further comprising:
   a first cap layer on at least a portion of the first dielectric layer and the upper surface of the metal feature;
   a second cap layer on at least a portion of the second dielectric layer and an upper surface of the first line; and
   a third cap layer on at least a portion of the third dielectric layer and an upper surface of the second line.

3. The metal fuse structure of claim 1, wherein the first dielectric layer, the second dielectric layer and the third dielectric layer are comprised of at least one of silicon oxide (SiO), silicon nitride (Si3N4), hydrogenated silicon oxycarbide (SiCOH), silsesquioxanes, carbon-doped oxides, thermosetting polyarylene ethers, polyarylene ether, spin-on silicon-carbon contained polymer material, other low dielectric constant (<3.9) materials or layers thereof.

4. The metal fuse structure of claim 1, wherein the metal feature, the first via, the second via, the third via, the first line and the second line are comprised of at least one of copper (Cu), aluminum (Al), silver (Ag), gold (Au) or alloys thereof.

5. The metal fuse structure of claim 2, wherein the first cap layer, the second cap layer and the third cap layer are comprised of at least one of silicon carbide (SiC), silicon nitride (Si3N4), silicon dioxide (SiO2), nitrogen, hydrogen doped silicon carbide (SiC(N,H)) or combinations thereof.

6. The metal fuse structure of claim 1, further comprising:
   a liner material deposited at least along sidewalls of the first via, the second via, the third via, the first line and the second line.

7. The metal fuse structure of claim 6, wherein the liner material comprises at least one of tantalum (Ta), tantalum nitride (TaN), titanium (Ti), titanium nitride (TiN), ruthenium (Ru), ruthenium nitride (RuN) or combinations thereof.

8. A metal fuse structure comprising:
   a first dielectric layer having a conductor embedded therein;
   a second dielectric layer above the first dielectric layer having a first conductive line and a first via embedded therein, the first via is on the conductor, the first conductive line is on the first via, the first via is the only electrical connection between the first conductive line and the conductor; and
   a third dielectric layer above the second dielectric layer having a second conductive line, a second via and a third via embedded therein, the second via and the third via are both on the first conductive line, the second conductive line is on both the first via and the second via.

9. The metal fuse structure of claim 8, wherein the first dielectric layer, the second dielectric layer and third dielectric layer are comprised of at least one of silicon oxide (SiO), silicon nitride (Si3N4), hydrogenated silicon oxycarbide (SiCOH), silsesquioxanes, carbon-doped oxides, thermosetting polyarylene ethers, polyarylene ether, spin-on silicon-carbon contained polymer material, other low dielectric constant (<3.9) materials or layers thereof.

10. The metal fuse structure of claim 8, wherein the conductor, the first via, the second via, the third via, the first conductive line and the second conductive line are comprised of at least one of copper (Cu), aluminum (Al), silver (Ag), gold (Au) or alloys thereof.

11. The metal fuse structure of claim 8, further comprising:
    a first cap layer on the first dielectric layer and on at least a portion of the upper surface of the conductor;
    a second cap layer on the second dielectric layer and on at least a portion of an upper surface of the first conductive line; and
    a third cap layer on the third dielectric layer and on an upper surface of the second conductive line.

12. The metal fuse structure of claim 11, wherein the first cap layer, the second cap layer and the third cap layer are comprised of at least one of silicon carbide (SiC), silicon nitride (Si3N4), silicon dioxide (SiO2), nitrogen, hydrogen doped silicon carbide (SiC(N,H)) or combinations thereof.

13. The metal fuse structure of claim 8, further comprising:
    a liner material at least along sidewalls of the first via, the second via and the third via, and at least along sidewalls of the first conductive line and the second conductive line.

14. The metal fuse structure of claim 13, wherein the liner material comprises at least one of tantalum (Ta), tantalum nitride (TaN), titanium (Ti), titanium nitride (TiN), ruthenium (Ru), ruthenium nitride (RuN) or combinations thereof.

15. A fuse structure comprising:
    a first dielectric layer comprising a conductor embedded therein;
    a second dielectric layer above the first dielectric layer comprising a first conductive line and a single via embedded therein, the single via is in direct contact with and extends between the first conductive line and the conductor, the single via is the only electrical connection between the first conductive line and the conductor; and
    a third dielectric layer above the second dielectric layer comprising a second conductive line and a pair of vias embedded therein, the pair of vias are in direct contact with and extend between the second conductive line and the first conductive line; and
    an electrical path including the conductor, the single via, the first conductive line, the pair of vias and the second conductive line, the current through each of the pair of vias is less than the current through the single via.

16. The metal fuse structure of claim 15, wherein the first dielectric layer, the second dielectric layer and third dielectric layer are comprised of at least one of silicon oxide (SiO), silicon nitride (Si3N4), hydrogenated silicon oxycarbide (SiCOH), silsesquioxanes, carbon-doped oxides, thermosetting polyarylene ethers, polyarylene ether, spin-on silicon-carbon contained polymer material, other low dielectric constant (<3.9) materials or layers thereof.

17. The metal fuse structure of claim 15, wherein the conductor, the single via, the pair of vias, the first conductive line and the second conductive line are comprised of at least one of copper (Cu), aluminum (Al), silver (Ag), gold (Au) or alloys thereof.

18. The metal fuse structure of claim 15, further comprising:
- a first cap layer between the first dielectric layer and the second dielectric layer, and in direct contact with at least a portion of an upper surface of the conductor;
- a second cap layer between the second dielectric layer and the third dielectric layer, and in direct contact with at least a portion of an upper surface of the first conductive line; and
- a third cap layer on at least a portion of the third dielectric layer and an upper surface of the second line.

19. The metal fuse structure of claim 18, wherein the first cap layer, the second cap layer and the third cap layer are comprised of at least one of silicon carbide (SiC), silicon nitride (Si3N4), silicon dioxide (SiO2), nitrogen, hydrogen doped silicon carbide (SiC(N,H)) or combinations thereof.

20. The metal fuse structure of claim 15, further comprising:
- a liner material at least along sidewalls of the first via, the second via and the third via, and at least along sidewalls of the first conductive line and the second conductive line.

21. The metal fuse structure of claim 20, wherein the liner material comprises at least one of tantalum (Ta), tantalum nitride (TaN), titanium (Ti), titanium nitride (TiN), ruthenium (Ru), ruthenium nitride (RuN) or combinations thereof.

* * * * *